(12) United States Patent
Wingate et al.

(10) Patent No.: US 9,409,289 B2
(45) Date of Patent: Aug. 9, 2016

(54) SYSTEM, METHOD, AND APPARATUS, FOR A HANDLE ATTACHMENT FOR A MOBILE DEVICE

(71) Applicants: Barry Wingate, San Jose, CA (US); Chien Hsu Chen, Millbrae, CA (US)

(72) Inventors: Barry Wingate, San Jose, CA (US); Chien Hsu Chen, Millbrae, CA (US)

(73) Assignee: Zircon Corporation, Campbell, CA (US)

( * ) Notice: Subject to any disclaimer, the term of this patent is extended or adjusted under 35 U.S.C. 154(b) by 0 days.

(21) Appl. No.: 14/655,691

(22) PCT Filed: Dec. 31, 2013

(86) PCT No.: PCT/US2013/078492
§ 371 (c)(1),
(2) Date: Jun. 25, 2015

(87) PCT Pub. No.: WO2014/107452
PCT Pub. Date: Jul. 10, 2014

(65) Prior Publication Data
US 2015/0343629 A1    Dec. 3, 2015

Related U.S. Application Data

(60) Provisional application No. 61/748,421, filed on Jan. 2, 2013.

(51) Int. Cl.
| | | |
|---|---|---|
| *A45C 13/22* | (2006.01) | |
| *B25J 1/04* | (2006.01) | |
| *A45F 5/10* | (2006.01) | |

(Continued)

(52) U.S. Cl.
CPC ... *B25J 1/04* (2013.01); *A45F 5/10* (2013.01); *B25G 3/38* (2013.01); *H05K 5/0086* (2013.01)

(58) Field of Classification Search
CPC ............. Y10T 16/469; Y10T 16/4559; A45F 2200/05; A45F 2200/0516; A45F 2200/10; A45F 5/00; A45F 5/10; A45F 2005/008; F16M 13/00; F16M 13/04; B25J 1/04; B25G 3/38; B25G 3/00; B25G 3/02; B25G 3/08; B25G 3/18; B25G 3/10; B25G 3/26; G03B 17/00; G03B 17/561; G03B 17/563; G03B 17/566; G03B 17/565; H05K 5/023; A46B 2200/202; A46B 7/04; H04B 1/388
See application file for complete search history.

(56) References Cited

U.S. PATENT DOCUMENTS

| | | | | | |
|---|---|---|---|---|---|
| 2,591,214 | A | * | 4/1952 | Tamarin | .................... A47L 5/30 |
| | | | | | 15/323 |
| 3,362,037 | A | * | 1/1968 | Griffin | .................. A47L 13/255 |
| | | | | | 15/144.1 |
| 4,127,911 | A | * | 12/1978 | Cupp | ...................... B05C 17/00 |
| | | | | | 15/144.1 |

(Continued)

*Primary Examiner* — Chuck Mah
(74) *Attorney, Agent, or Firm* — Omair M. Farooqui

(57) ABSTRACT

The present invention relates generally to a system, method, and apparatus for a handle coupled to a device. More specifically, aspects of the present invention relate to a handle releasably coupled to a device. Further still, aspects of the present invention relate to a handle releasably coupled to a hatch that is releasably coupled to a device. Further still, aspects of the present invention relate to a two-axis pivoting handle reliably and releasably coupled to a device. In still other aspects the present invention relates to a device coupled to a releasable handle via a releaseable hatch, and wherein the handle optionally having means for extending the handle. Optionally, the device has an electronic device secured thereto, and wherein the electronic device has at least one means to communicate with a computer device.

20 Claims, 7 Drawing Sheets

(51) Int. Cl.
*H05K 5/00* (2006.01)
*B25G 3/38* (2006.01)

(56) References Cited

U.S. PATENT DOCUMENTS

| | | | | |
|---|---|---|---|---|
| 4,530,580 A * | 7/1985 | Ueda | ............... | F16M 13/04 248/187.1 |
| 4,892,437 A * | 1/1990 | Kraft | ............... | E04F 21/24 404/114 |
| 5,333,347 A * | 8/1994 | Stranders | ............... | A47L 1/06 15/144.2 |
| 5,375,286 A * | 12/1994 | Harrah | ............... | A46B 5/0095 15/147.1 |
| 5,393,168 A * | 2/1995 | Jarvis | ............... | E04F 21/241 15/235.8 |
| 5,596,787 A * | 1/1997 | Stevens | ............... | A47L 1/15 15/144.2 |
| 5,694,815 A * | 12/1997 | Biber | ............... | G02B 21/0012 16/422 |
| 6,178,584 B1 * | 1/2001 | Post | ............... | A47L 1/15 15/144.1 |
| 6,227,750 B1 * | 5/2001 | Maggio | ............... | F16C 11/103 15/235.8 |
| 6,824,180 B2 * | 11/2004 | Tomchak | ............... | A01B 1/22 15/145 |
| 6,827,523 B2 * | 12/2004 | Medendorp | ............... | E01C 19/44 15/143.1 |
| 7,321,684 B2 * | 1/2008 | Kim | ............... | G06F 17/3025 382/162 |
| 7,383,602 B2 * | 6/2008 | Tanaka | ............... | A47L 13/24 15/147.2 |
| 7,396,187 B1 * | 7/2008 | Meyers | ............... | A47G 27/0487 16/110.1 |
| 7,650,665 B2 * | 1/2010 | Morris | ............... | A47L 13/254 15/144.2 |
| 7,739,770 B2 * | 6/2010 | Tanaka | ............... | A47L 13/20 15/209.1 |
| 8,528,152 B1 * | 9/2013 | Hogan | ............... | E01C 19/43 15/235.4 |
| 2004/0255477 A1 * | 12/2004 | Levine | ............... | G01C 15/004 33/286 |
| 2005/0011536 A1 * | 1/2005 | Hofte | ............... | A47L 13/10 134/6 |
| 2006/0042047 A1 * | 3/2006 | Decker | ............... | A47L 9/0036 16/430 |
| 2008/0313858 A1 * | 12/2008 | Blom | ............... | B25G 1/04 16/427 |
| 2010/0236571 A1 * | 9/2010 | Haziza | ............... | A45D 2/146 132/210 |
| 2012/0312955 A1 * | 12/2012 | Randolph | ............... | F16M 11/10 248/688 |

* cited by examiner

SYSTEM, METHOD, AND APPARATUS, FOR A HANDLE ATTACHMENT FOR A MOBILE DEVICE

The instant patent application claims priority to and the benefit of U.S. Provisional Patent Application Ser. No. 61/748,421, filed on Jan. 2, 2013, titled "SYSTEM, METHODS AND APPARATUS FOR A HANDLE ATTACHMENT," the entire disclosure of which provisional application is incorporated herein by reference.

FIELD OF THE INVENTION

The present invention relates generally to a system, method, and apparatus for a handle coupled to a device. More specifically, aspects of the present invention relate to a handle releasably coupled to a device. Further still, aspects of the present invention relate to a handle releasably coupled to a hatch that is releasably coupled to a device. Further still, aspects of the present invention relate to a two-axis pivoting handle reliably and releasably coupled to a device. In still other aspects the present invention relates to a device coupled to a releasable handle via a releaseable hatch, and wherein the handle optionally having means for extending the handle. Optionally, the device has an electronic device secured thereto, and wherein the electronic device has at least one means to communicate with a computer device.

BACKGROUND INFORMATION

Building tradespersons, such as, carpenters, electricians, cabinet installers, and the like, are often faced with the problem of locating the position of wall studs, including but not limited to metal, wood, and plastic studs, metal objects, wooden objects, heat signatures, electrical wiring, plumbing, and other imbedded or hidden gases, liquids, or solids, behind a surface such as, for example, the installed sheetrock or wallboard forming the wall surface. For example, such walls are usually formed of the wall studs positioned on about 16 inches centers to which are nailed such wall materials as sheetrock or plywood of various thicknesses ranging from about ⅛ inch to about ¾ inch. After the finishing and painting of the wall, the nails, stud positions, electrical wiring, plumbing and piping, and other imbedded or hidden gases, liquids, and solids, are not visually detectable.

For example, in the case of wall studs, at the present time, a generally used method to locate the position of wall studs includes utilizing a stud finder consisting primarily of a magnet supported in a manner to pivot in the presence of a magnetic material. This finder is moved along the wall surface until it aligns with the head of a nail holding the wallboard on the stud. This form of stud finder may be housed in a casing and used as a portable sensor.

An additional method to locate the position of wall studs includes utilizing a portable sensor for locating a wall stud positioned behind a wall surface by movement of the sensor along the wall surface comprising in combination, a capacitor plate mounted in the surface closest to the wall surface, a circuit for detecting any change in the capacitance of the capacitor plate due to a change in the dielectric constant of the wall caused by the location of a stud positioned behind the wall surface and immediately adjacent the capacitor, and means for indicating the change in capacitance of the capacitor plate, thereby indicating the wall stud position. This method and apparatus is fully described in U.S. Pat. No. 4,099,118 (Robert C. Franklin, et al.), and is incorporated fully herein by reference.

Thus it can be seen that previous attempts to locate the wall studs were hand-held only. This severely limited the use of the stud-sensor to the height and/or arm length of the user. Further, if a user wanted to determine the position of studs beyond his physical abilities, such as, for example, a high wall or the ceiling, he would have to use a chair or ladder or other device to increase the area of usage. Still further, if a user wanted to determine the position of studs close to the floor or on the floor, he would have to get on his hands and knees to scan the wall or the floor. Both previously existing methods are tedious, time-consuming, and potentially dangerous.

This invention improves on the deficiencies of the prior art and provides an inventive system, method, and apparatus, for a handle attachment.

PURPOSES AND SUMMARY OF THE INVENTION

The invention in one aspect is an inventive system, method, and apparatus, for a handle attachment.

Therefore, one purpose of this invention is to releasably couple a handle to a device.

Another purpose of this invention is to provide a handle that is releasably coupled to a hatch that is releasably coupled to a device.

Yet another purpose of this invention is to provide a two-axis pivoting handle reliably, and releasably, coupled to a device.

Still yet another purpose of this invention is to provide a handle releasably coupled to a device, which handle can be telescopically extended to extend the reach of the device from a floor to a ceiling.

Therefore, in one aspect this invention comprises a handle attachment for a mobile device, comprising:

(a) a handle, said handle having a tip end, and a back end, said tip end, having a first tip axle, and a second tip axle, wherein said first tip axle and said second tip axle are on the opposite side of said tip end;

(b) a hatch, said hatch having a first hatch axle, and a second hatch axle, wherein said first hatch axle and said second hatch axle are on the opposite side of said hatch, and wherein said hatch further has an extension, wherein said extension has a first spring engaging means, and a second spring engaging means, and wherein said hatch further has a channel area formed by a first channel wall, and a second channel wall;

(c) a device, said device having a first section, a second section, and a third section, and wherein said second section has a blind hole to releasably and engageably accommodate at least a portion of said hatch; and (d) wherein a portion of said tip end of said handle is inserted into a portion of said hatch such that said first tip axle is releasably and engageably secured by said first channel wall, and said second channel wall, and wherein said second tip axle is releasably and engageably secured by said first spring engaging means and said second spring engaging means, and said hatch is releasably and engageably secured to said device within said blind hole to form said handle attachment for a mobile device.

In another aspect this invention comprises a handle attachment for a mobile device, comprising:

(a) a handle, said handle having a tip end, and a back end, said tip end, having a first tip axle, and a second tip axle, wherein said first tip axle and said second tip axle are on the opposite side of said tip end;

(b) a hatch, said hatch having a first hatch axle, and a second hatch axle, wherein said first hatch axle and said second hatch axle are on the opposite side of said hatch, and wherein said hatch further has an extension, wherein said extension has a first spring engaging means, and a second spring engaging means, and wherein said hatch further has a channel area formed by a first channel wall, and a second channel wall;

(c) a device, said device having a first section, a second section, and a third section, and wherein said second section has a blind hole to releasably and engageably accommodate at least a portion of said hatch;

(d) wherein a portion of said tip end of said handle is inserted into a portion of said hatch such that said first tip axle is releasably and engageably secured by said first channel wall, and said second channel wall, and wherein said second tip axle is releasably and engageably secured by said first spring engaging means and said second spring engaging means, and said hatch is releasably and engageably secured to said device within said blind hole to form said handle attachment for a mobile device; and (e) wherein said device has at least one chamber to accommodate at least one electronic device.

In yet another aspect this invention comprises a handle attachment for a mobile device, comprising:

(a) a handle, said handle having a tip end, and a back end, said tip end, having a first tip axle, and a second tip axle, wherein said first tip axle and said second tip axle are on the opposite side of said tip end;

(b) a hatch, said hatch having a first hatch axle, and a second hatch axle, wherein said first hatch axle and said second hatch axle are on the opposite side of said hatch, and wherein said hatch further has an extension, wherein said extension has a first spring engaging means, and a second spring engaging means, and wherein said hatch further has a channel area formed by a first channel wall, and a second channel wall;

(c) a device, said device having a first section, a second section, and a third section, and wherein said second section has a blind hole to releasably and engageably accommodate at least a portion of said hatch;

(d) wherein a portion of said tip end of said handle is inserted into a portion of said hatch such that said first tip axle is releasably and engageably secured by said first channel wall, and said second channel wall, and wherein said second tip axle is releasably and engageably secured by said first spring engaging means and said second spring engaging means, and said hatch is releasably and engageably secured to said device within said blind hole to form said handle attachment for a mobile device; and (e) wherein said device has at least one chamber to accommodate at least one electronic device, and wherein said at least one electronic device has at least one means to communicate with at least one computer device.

BRIEF DESCRIPTION OF THE DRAWINGS

Although the scope of the present invention is much broader than any particular embodiment, a detailed description of the preferred embodiment follows together with drawings. These drawings are for illustration purposes only and are not drawn to scale. Like numbers represent like features and components in the drawings. The invention may best be understood by reference to the ensuing detailed description in conjunction with the accompanying drawings.

DETAILED DESCRIPTION

At the outset, it is understood that aspects of the present invention may be implemented with tools, computers, and devices that scan surfaces for imbedded objects, such as, for example, wall studs, including but not limited to metal, wood, and plastic studs metal objects, wooden objects, heat signatures, electrical wiring, plumbing, and other imbedded or hidden gases, liquids, or solids.

Figure 1:
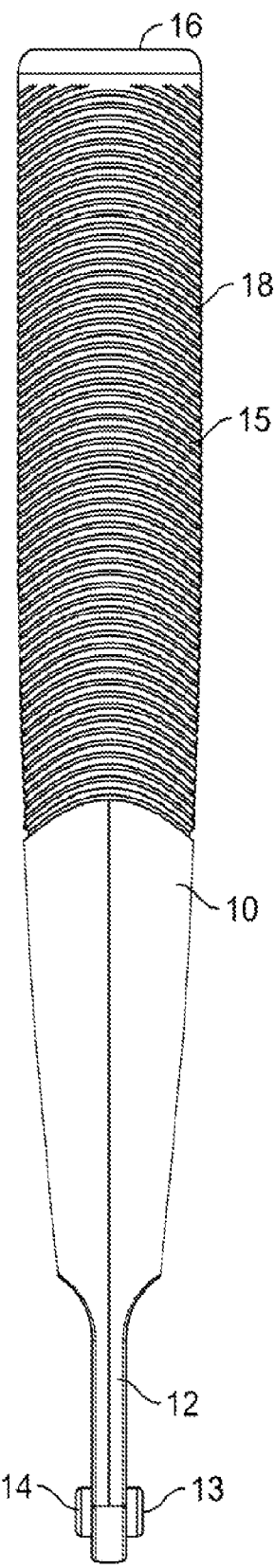
FIG. 1, depicts a side view of an exemplary embodiment of a handle of the present invention.

FIG. 1, depicts a side view of an exemplary embodiment of a handle or wand 10, of the present invention. The handle 10, has a tip or tip portion 12, a gripping portion 18, and a back end 16. The tip portion 12, has at least one exemplary axle, or tab, or male portion, or engaging means 13, 14, as shown. The at least one exemplary axle 13, 14, are preferably on the opposite side of the tip portion 12. The gripping portion 18, optionally has at least one gripping means 15, wherein the at least one gripping means 15, are selected from a group comprising a rubber gripping means 15, a rough surface gripping means 15, a series of indentations 15, a series of protrusions 15, and a combination thereof, to name a few. It is preferred that the axle 13, 14, on the tip 12, are symmetrical, so that they are interchangeable when mated with another device/tool.

Figure 2:
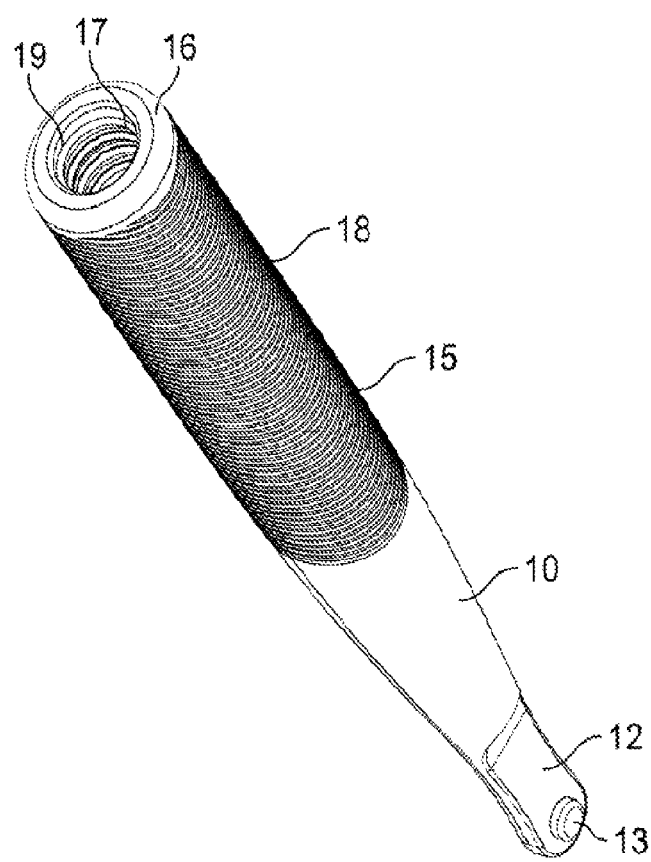
FIG. 2, depicts a perspective view of an exemplary embodiment of a handle of the present invention.

FIG. 2, depicts a perspective view of an exemplary embodiment of a handle 10, of the present invention. At least one axle 13, 14, is also shown in this exemplary embodiment. The back end 16, preferably has at least one opening or blind hole or cavity or female engaging means 17. The opening 17, preferably has at least one engaging means 19, such as, for example, threads 19. The engaging means 19, can be used to mate another device to the handle 10, such as, a extension pole 70, or a telescopic pole 80, shown in FIGS. 12, 15, 16.

Figure 3:
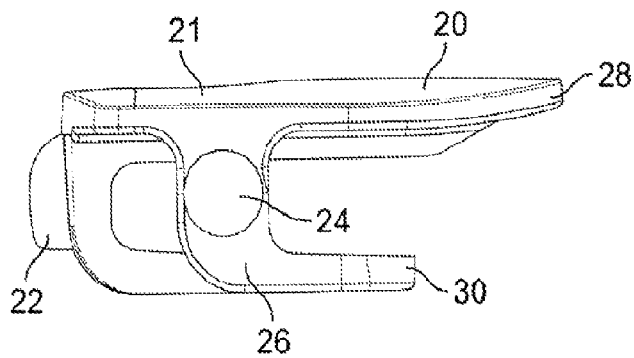
FIG. 3, depicts a side view of an exemplary embodiment of a hatch of the present invention.

FIG. 3, depicts a side view of an exemplary embodiment of a receiving member 20, of the present invention, here depicted as an exemplary hatch 20. The receiving member 20, or clip 20, or hatch 20, has an upper or top or first surface 21, and a bottom or second surface 28. The second surface 28, has at least one stop or stopper 22, and extension 30. The extension 30, has a side wall or arm 26, having an axle, or tab, or male portion, or engaging means 24, on one side, and a side wall or arm 27, having an axle, or tab, or male portion, or engaging means 25, on the other side, and preferably the opposite side, as more clearly shown in FIGS. 4, 5, and 6.

Figure 4:
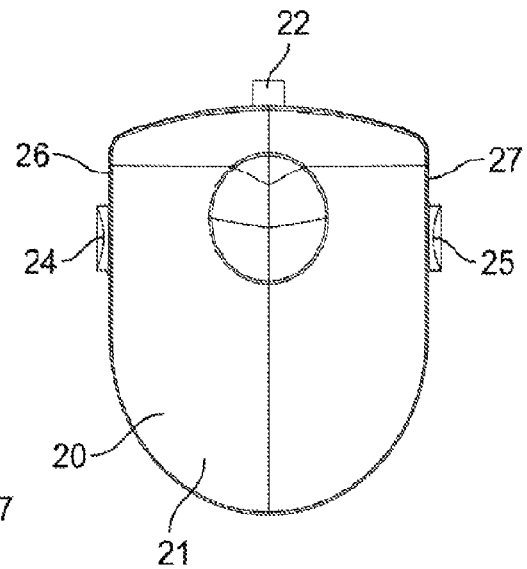
FIG. 4, depicts a top view of an exemplary embodiment of a hatch of the present invention.
Figure 5:
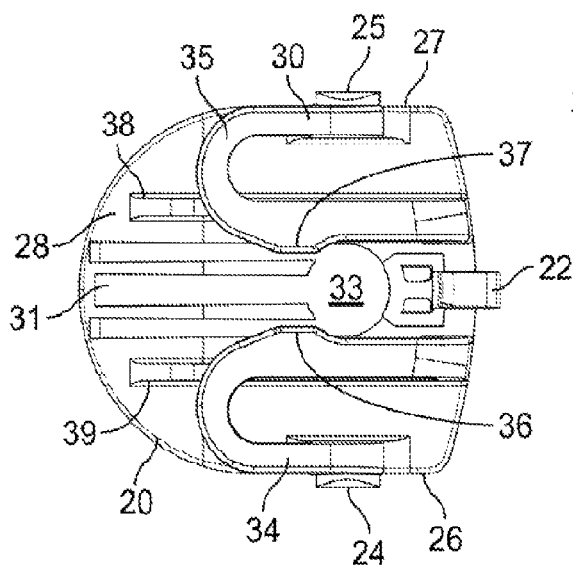
FIG. 5, depicts a bottom view of an exemplary embodiment of a hatch of the present invention.
Figure 6:
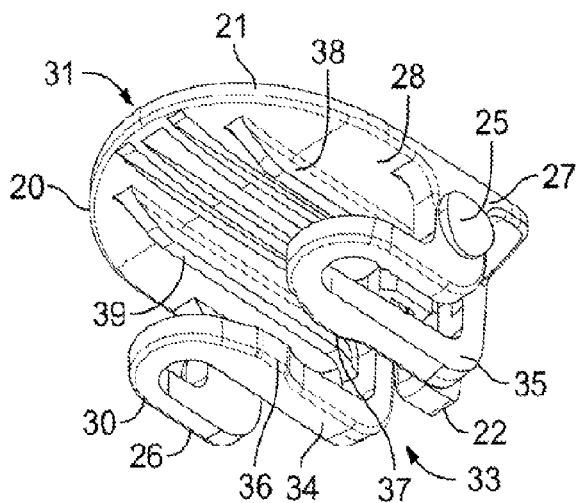
FIG. 6, depicts a bottom perspective view of an exemplary embodiment of a hatch of the present invention.

FIG. 4, depicts a top view of an exemplary embodiment of a receiving member 20, of the present invention, here depicted as an exemplary hatch 20, having a top or upper surface 21, a stop 22, a side wall or arm 26, having an axle, or tab, or male portion, or engaging means 24, on one side, and a side wall or arm 27, having an axle, or tab, or male portion, or engaging means 25, on the other side, and preferably the opposite side, as more clearly shown in FIGS. 4, 5, and 6.

FIG. 5, depicts a bottom view of an exemplary embodiment of a receiving member 20, of the present invention, here shown as an exemplary hatch 20. In the present exemplary embodiment, at least one axle 24, 25, is shown. In one embodiment, at least one end of the axle 24, 25, is convex so that the axle 24, 25, can be dislodged if overstressed to enable the hatch 20, or receiving member 20, to be releaseable. In one embodiment, at least one end of the axle 24, 25, is not convex. The bottom or second surface 28, of the hatch 20, has a leg extension 34, 35, having locking means 36, 37, respectively. The leg extensions 34, 35, along with the locking means 36, 37, form a locking area 33, for the releaseable engagement with the axle 13, 14, of the handle 10, as more clearly shown in FIG. 7. The leg extensions 34, 35, also form the spring arm or spring means 26, 27, respectively. The bottom or second surface 28, also has a channel area 31, which is between a first channel wall 38, and a second channel wall 39.

Figure 7:
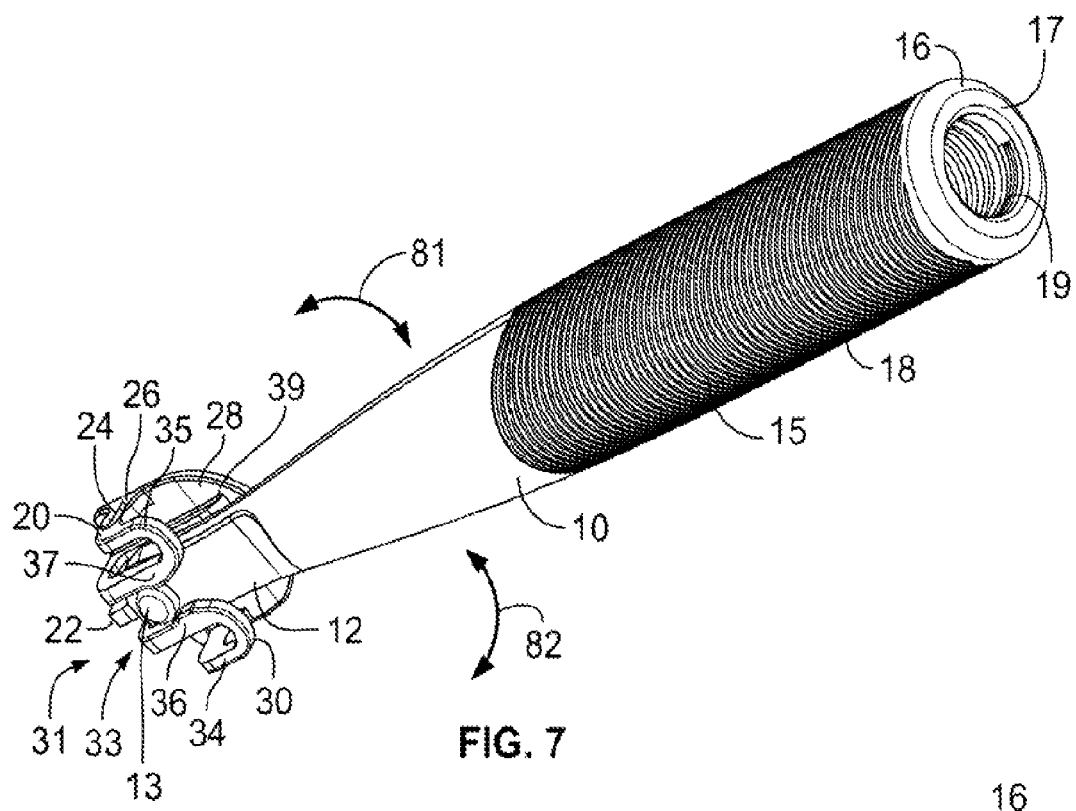
FIG. 7, depicts a bottom perspective view of an exemplary embodiment of a handle of the present invention, as mated with a receiving member of the present invention.
Figure 8:
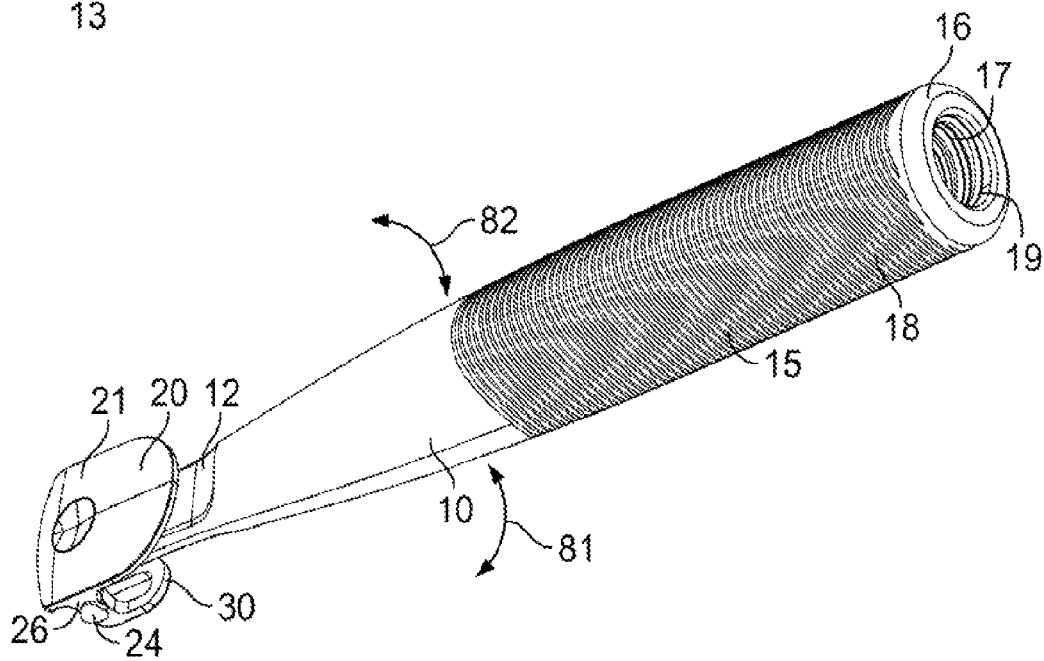
FIG. 8, depicts a top perspective view of an exemplary embodiment of a handle of the present invention.

FIG. 6, depicts a bottom perspective view of an exemplary embodiment of a hatch 20, of the present invention. In the embodiment shown, the exemplary arms 34, 35, of the exemplary hatch 20, are spring loaded to securely hold an exemplary handle 10, as more clearly shown in FIG. 7. In another embodiment, a space 33, between the spring loaded arms 34, 35, permits the axle 13, 14, of the handle 10, to securely rotate along a horizontal axis. The axle 13, 14, of the handle 10, are guided within the channel walls 38, 39, towards the stop 22, and once inside the exemplary hatch 20, the axle 13, 14, are securely, releasably, and engageably, held within the locking area 33, and the locking means 36, 37, as more clearly shown in FIG. 7, FIG. 7, depicts a bottom perspective view of an exemplary embodiment of a handle 10, of the present invention, as mated with a receiving member 20, of the present invention. In one embodiment, the exemplary arms 26, 27, of the exemplary hatch 20, are spring-loaded to receive the handle 10. In one embodiment, at least one axle 13, 14, 14, of the exemplary handle 10, fits snugly between the arms 26, 27, of the exemplary hatch 20. The stop 22, prevents the tip 12, from moving forward after the handle 10, has been releasably and engageably mated with the receiving member 20. As shown in FIGS. 7, and 8, the exemplary handle 10, once mated with the receiving member 20, securely rotates along a horizontal axis, or from a left side or a first side to a right side or second side within the receiving member 20, as shown by arrows 81, 82. As one can see that the first axle 13, 14, slides into the hatch 20, and is securely, releasably, and engageably held by the spring loaded members 34, 35, 36, 37, of the extension 30, while the second axle 14, 13, (not shown) is securely, releasably, and engageably held within the channels 38, 39, in the vicinity of the locking area 33.

FIG. 8, depicts a top perspective view of an exemplary embodiment of a handle 10, coupled with an exemplary receiving member 20, here shown as an exemplary hatch 20.

Figure 9:
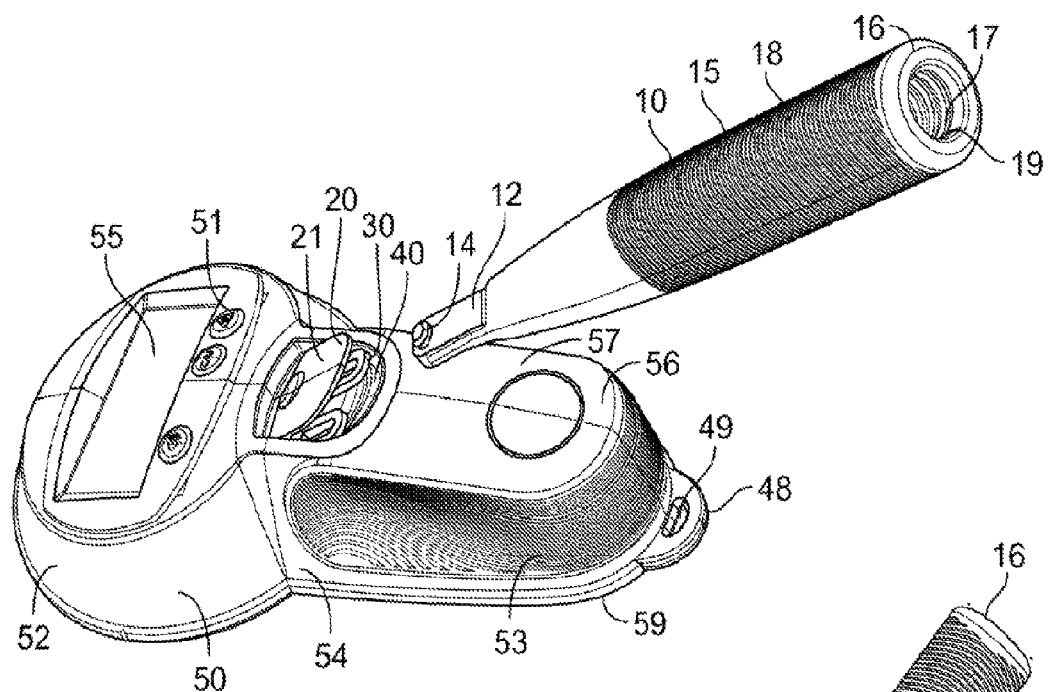
FIG. 9, depicts a perspective view of an exemplary embodiment of the present invention showing a mobile device.

FIG. 9, depicts a perspective view of an exemplary embodiment of the present invention showing a mobile device or tool 50. The mobile device or tool 50, has a front section 52, a mid-section 54, a back or rear section 56, an upper or first section 57, and a lower or second section 59. Preferably, the front section 52, has a display or display area 55, and at least one button, or switch 51. It is preferable that the mid-section 54, has a hatch cavity or a blind hole 40, to accommodate the receiving member 20, along with a portion of the tip 12, having the axle 13, 14. The back or rear section 56, can optionally have an extension 48, having a hole or opening 49. The exemplary handle 10, shown is separated from the exemplary receiving member 20, here shown as an exemplary hatch 20. At least one exemplary axle 13, 14, is also shown on the tip 12, of the handle 10, which is used to mate with the receiving member 20. Optionally, the tool 50, could have at least one anti-skid or gripping means 53, and wherein the at least one gripping means 53, could be selected from a group comprising a rubber gripping means 53, a rough surface gripping means 53, a series of indentations 53, a series of protrusions 53, and a combination thereof, to name a few.

Figure 10:
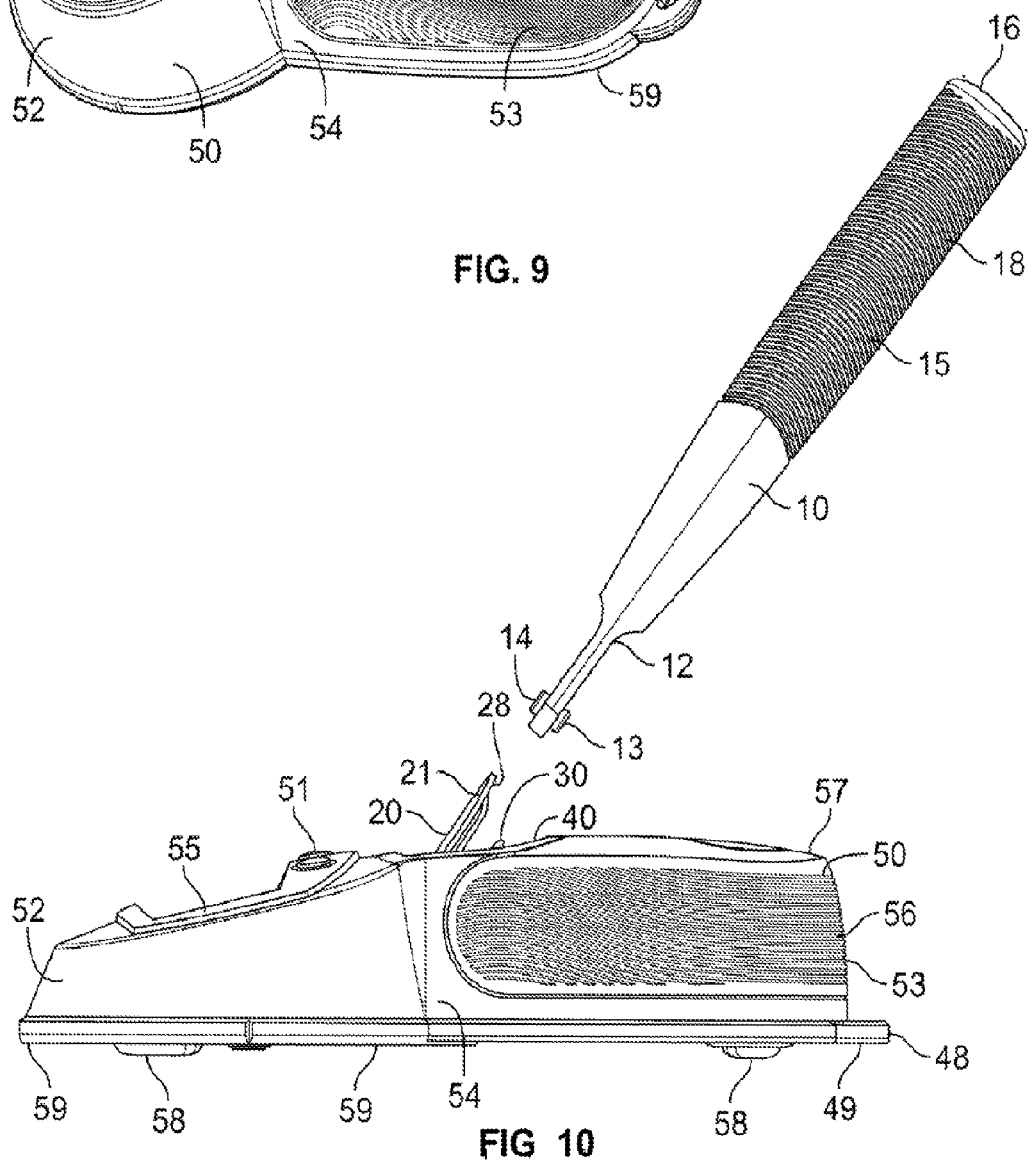
FIG. 10, depicts a side view of an exemplary embodiment of the present invention of a mobile device.

FIG. 10, depicts a side view of an exemplary embodiment of the present invention of a tool or mobile device 50, where the exemplary handle 10, is separated from the exemplary receiving member 20, here shown as an exemplary hatch 20. In this exemplary embodiment at least one axle 13, 14, is shown on the tip 12, of the handle 10, which are about to be coupled or mated with the exemplary receiving member 20. For some applications it would be preferred to have at least one pad 58, on the lower or second surface 59, of the tool 50.

Figure 11:
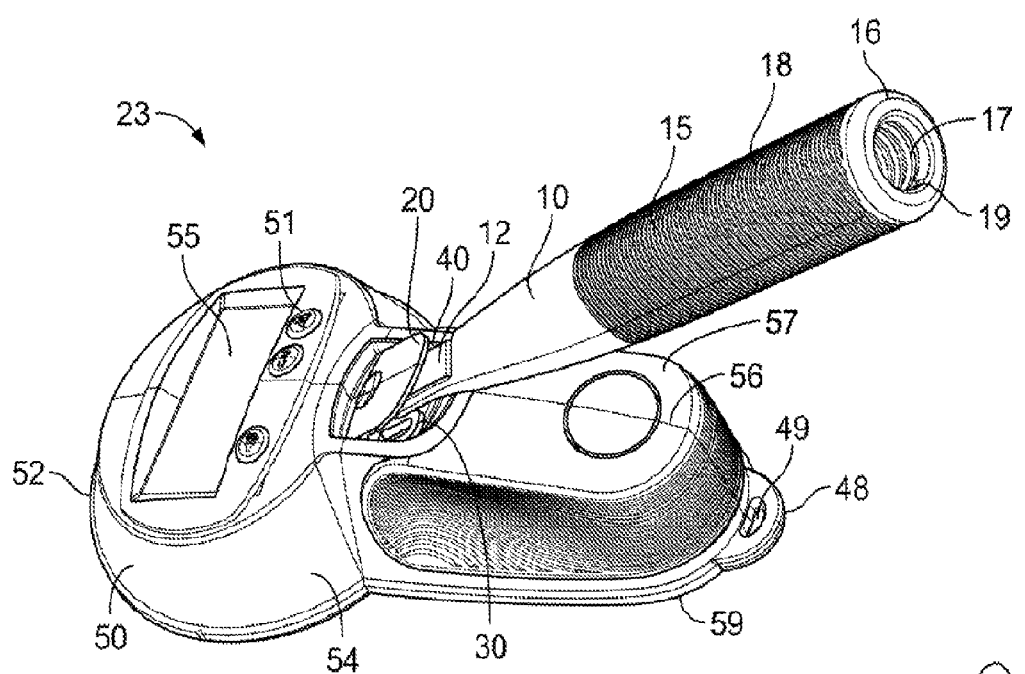
FIG. 11, depicts a perspective view of an exemplary embodiment of the present invention illustrating the handle mated with a tool via a receiving member.

FIG. 11, depicts a perspective view of an exemplary embodiment 23, of the present invention illustrating the handle 10, mated with a tool 50, via a receiving member 20. In the exemplary embodiment shown, an exemplary handle 10, is releasably coupled to an exemplary receiving member 20. In this exemplary embodiment, the exemplary handle 10, is releasably coupled to an exemplary hatch 20. However, in another exemplary embodiment, the exemplary receiving member 20, may not be releasably coupled with the tool 50, and may be fixed. In the present exemplary embodiment, the handle 10, has at least one exemplary axle 13, 14, on the inserting end 12, of the handle 10. In one embodiment the tip 12, of the handle 10, has at least one exemplary axle 13, 14, on the inserting end 12, of the handle 10. In this exemplary embodiment, the tip 12, of the handle 10, is engaged with the receiving portion of the exemplary hatch 20. The exemplary axle 13, 14, of the exemplary handle 10, permits the handle 10, to swing on horizontal axis when coupled with the hatch 20, as more clearly shown with reference to FIGS. 7 and 8.

Figure 12:
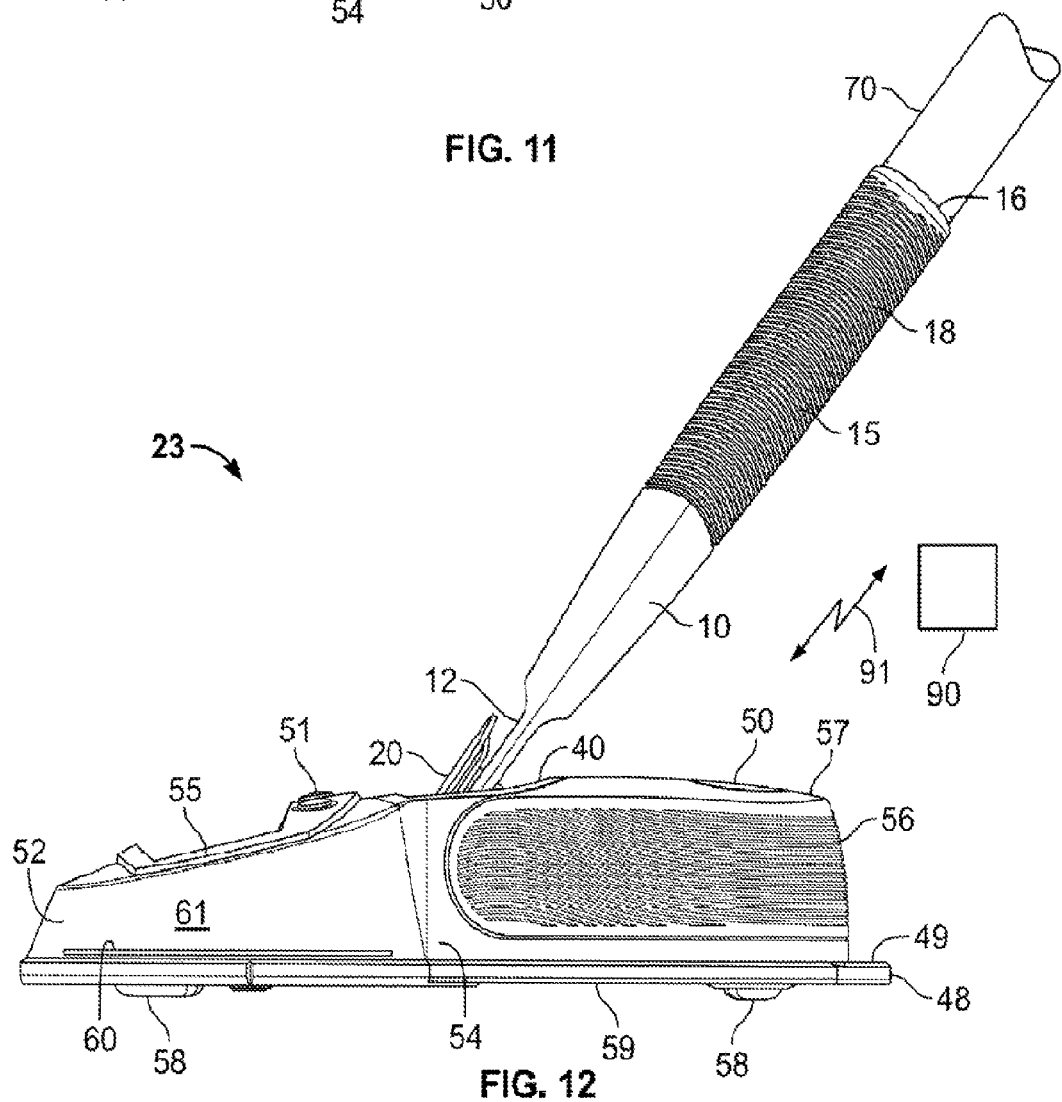
FIG. 12, depicts a side view of an exemplary embodiment of the present invention illustrating the handle mated with a tool via a receiving member and further having a handle extension.
Figure 15:
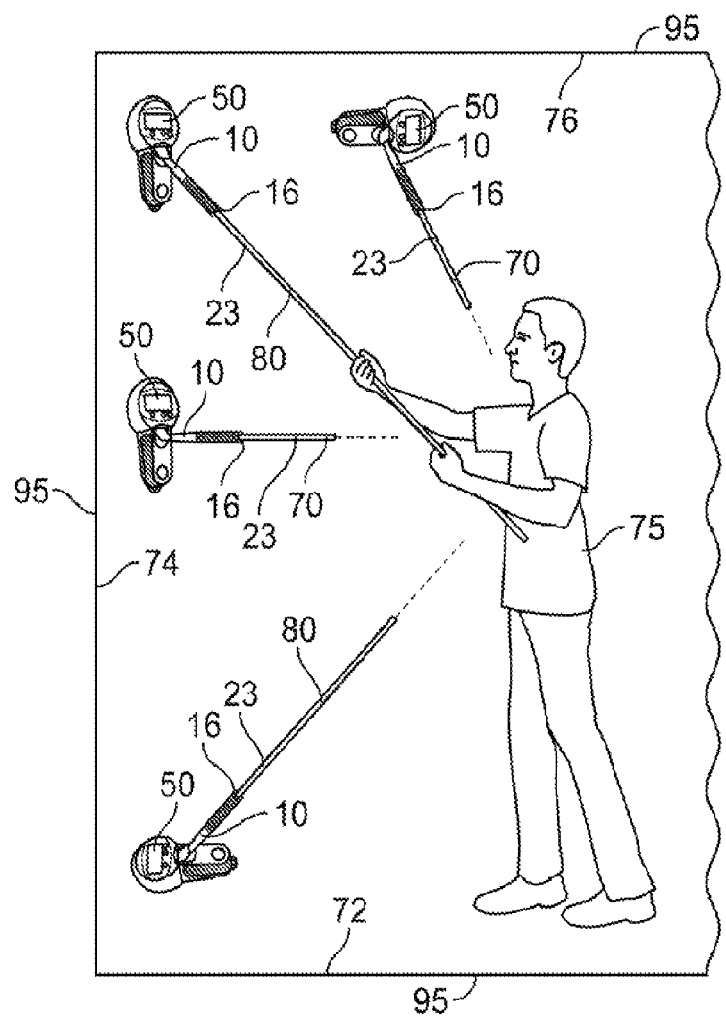
FIG. 15, depicts usage of an exemplary embodiment of the present invention.
Figure 16:
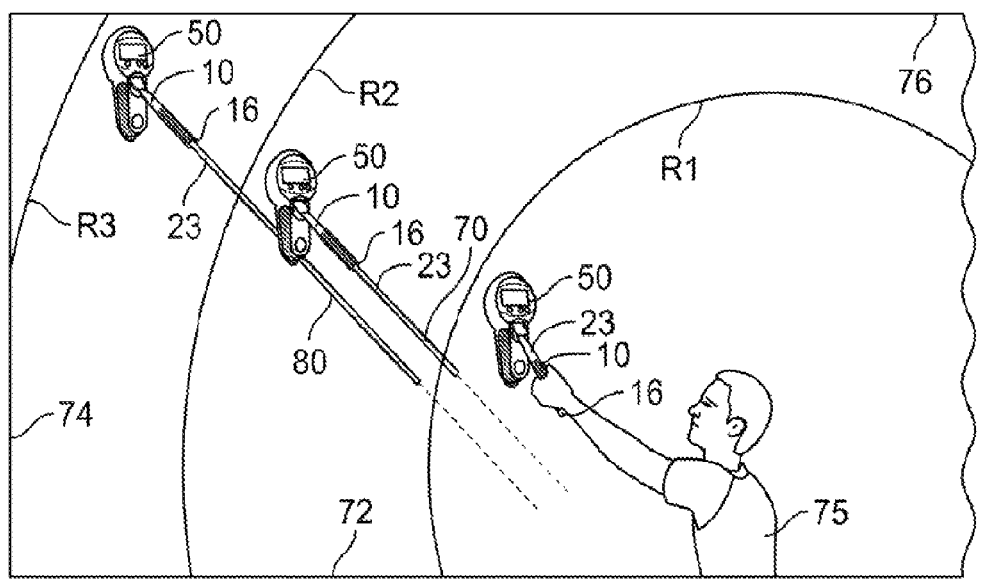
FIG. 16, depicts usage of an exemplary embodiment of the present invention.

In the embodiment shown in FIG. 11, the opposite or back end 16, of the exemplary handle 10, that is coupled with the exemplary receiving member 20, the exemplary handle 10, is designed to receive at least one further extension 70, 80, as shown in FIGS. 12, 15, 16, which will enable a user 75, to further extend the zone of operation of the tool 50. In an embodiment, the exemplary handle 10, may be wholly or partially tubular in nature to receive the further extending member 70, 80. In an embodiment, the exemplary handle 10, may also be threaded 19, to enable a more reliable coupling with an extending member 70, 80. In another embodiment, the exemplary handle 10, may be designed to receive a smaller tubular extending member 70, 80, which is inserted into the exemplary handle 10. In another embodiment, the exemplary extending member 70, 80, may also be designed to further receive additional extending members 70, 80. In another exemplary embodiment, the extending members 70, 80, may be collapsible tubular inserts 70, 80, which may be pulled in and out to achieve a desired length. In another exemplary embodiment the extending members 70, 80, may be a telescopic extending members 70, 80.

FIG. 12, depicts a side view of an exemplary embodiment 23, of the present invention illustrating the handle 10, mated with a tool 50, via a receiving member 20, and further having a handle extension 70. The tool 50, could be provided with an electronic device 60, within a cavity or chamber 61. The electronic device 60, would preferably be able to communicate with another electronic device 60, or a computer 90, or a server 90, preferably using a medium 91, such as, a wired medium 91, or a wireless medium 91. It should be understood that the second device 60, could be a computer 90, and may be located at a different location 90. In the exemplary embodiment shown, an exemplary handle 10, is coupled to an exemplary receiving member 20. In this exemplary embodiment, the exemplary handle 10, is releasably coupled to an exemplary hatch 20. The exemplary hatch 20, is releasably coupled to an exemplary tool 50. In one exemplary embodiment, the handle 10, may be made of plastic or any other substance that would not interfere with any type of sensor 60, associated with the tool 50, and contained within a cavity or chamber 61, within the tool 50. In one exemplary embodiment, the handle 10, is designed to receive a further extension 70, 80, as described in FIGS. 12, 15, 16. In one exemplary embodiment, the handle 10, may be made of a substance to prevent a further extension from interfering with any sensor 60, associated with the tool 50. Such as, for example, if the exemplary extension 70, 80, is made of metal, or any other material that may interfere with any sensor 60, of the tool 50, the exemplary handle 10, would act as a buffer to avoid or reduce such potential interference. In one exemplary embodiment, the exemplary handle 10, would reduce the chances of, or prevent, any false readings or measurements of the tool or mobile device or sensing device 50, due to interference.

Figures 13, 14:
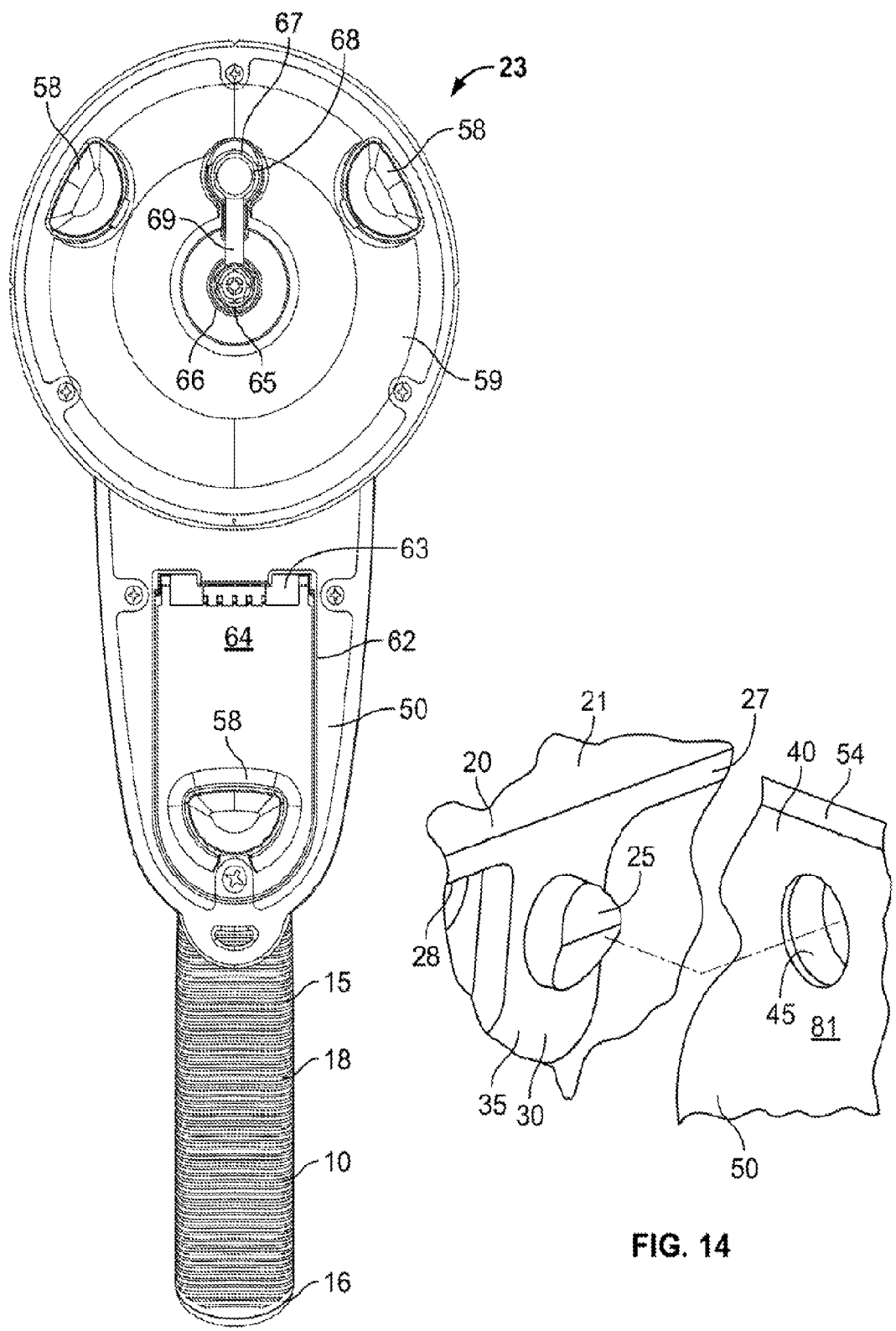
FIG. 13, depicts a bottom view of an exemplary embodiment of the present invention.
FIG. 14, depicts a side perspective view of an exemplary embodiment of a hatch of the present invention and an exemplary embodiment of a cavity of an exemplary tool of the present invention.

FIG. 13, depicts a bottom view of an exemplary embodiment 23, of the present invention. As one can see that the bottom surface 59, has at least one optional pad 58, which optional pad 58, would allow the tool 50, to smoothly glide over a surface where the tool 50, is being used. For some applications the tool 50, could have a battery compartment 62, where a cover 64, would securely contain a battery (not shown) inside the battery compartment 62. The cover 64, could have a hinge or a securing means or tabs 63, to allow the secure opening and closing of the battery compartment 62, using the cover 64. For some applications the lower or bottom surface 59, of the tool 50, could have an ink reservoir or marking means 66, contained inside a cavity or chamber or blind hole 65. When not in use, the ink reservoir 66, could be protected via a cap or cover 68. Optionally, the cap 68, could be provided with a strap 69, whose one end could be secured to the cap 68, and the opposite end could be secured to a portion of the surface 59, such as, an area around the ink reservoir 66. For some applications the bottom surface 59, could be provided with a cap or cover area 67, for the secure placement of the cap or cover 68, while the ink or marking means 66, was being used. The ink or marking means 66, would preferably be used to mark a spot on a surface, as desired by the user 75.

FIG. 14, depicts a side perspective view of an embodiment of the present invention, depicting at least one axle 24, 25, of an exemplary hatch 20. In this exemplary embodiment, at least one axle 24, 25, is convex and is insertable into an exemplary portion or blind hole or female receiving means 45, within the cavity 40, of the tool 50, which would be designed to receive the axle 24, 25. In one embodiment the portion of the tool 50, designed to receive the axle 24, 25, may be located within the side wall 81, of the cavity 40, of the tool 50. In one embodiment, an exemplary member may be used to receive the axle 24, 25, and may be coupled to the periphery of the tool 50. In another embodiment, the receiving portion for the axle 24, 25, may be located anywhere on the tool 50.

FIG. 15, depicts usage of an exemplary embodiment of the present invention. In one embodiment of the present invention, a user 75, may use the inventive tool 23, to operate on a wall 74, or a ceiling 76, or on a floor 72, or use any other surface scanner 50, in a standing or seated position by using an exemplary handle 10, or an exemplary handle 10, coupled with at least one extending member 70, 80. In this exemplary embodiment, the tip 12, of the handle 10, after engagement with the exemplary hatch 20, operates as a lever to enable the tool 50, to be rotated 360° along the surface 72, 74, 76, in any direction by rotating the handle 10, as desired by the user 75. The tool or device 50, could be used to scan surface 72, 74, 76, for imbedded objects 95, such as, for example, wall stud 95, metal stud 95, wood stud 95, plastic stud 95, metal object 95, wooden object 95, plastic object 95, heat signature 95, electrical wiring 95, plumbing 95, other imbedded or hidden gases 95, liquids 95, solids 95, to name a few. The invention allows for the standing or seated operation by the operator 75, or user 75, of a device 50, such as, a wall, ceiling, or floor scanner 50, and also to allow the user 75, or operator 75, to extend his/her reach and control of the scanner 50. The scanner or device 50, can be held flat against the surface 72, 74, 76, to be scanner at a wide range of angles from the operator 75, or user 75. As stated earlier that the orientation of the scanner or device 23, 50, on the surface to be scanned. 72, 74, 76, can be controlled by rotating the handle 10, 70, 80.

FIG. 16, depicts usage of an exemplary embodiment of the present invention. In an embodiment, the handle 10, is releasably coupled to the exemplary receiving member 20. In another embodiment the exemplary receiving member 20, here shown as an exemplary hatch 20, is releasably coupled to the tool 50. In one embodiment the exemplary handle 10, may be extended to receive at least one extending member 70, 80. In one embodiment, each extending member 70, 80, may be designed to receive additional extending members 70, 80, to further extend the reach of the tool 50. As shown in FIG. 16, the reach of the user 75, using a short or small handle 10, is only to radius R1, however, this reach can be easily extended to radius R2, by attaching an extension 70, to the handle 10, or to a radius which is still further away, such as, a radius R3, by either using a telescopic type extension 80, which is secured to handle 10, or multiple extensions 70, that are attached in series to form the extension 80. Therefore, as one can appreciate that the user 75, from the same location can access greater distances for the tool 50, by using the handle 10, secured to the inventive receiving member 20. As stated earlier that the handle attachment 10, 70, 80, can be interchangeable to accommodate different desired total reach, such as, reach R1, reach R2, reach R3, to name a few. As one can appreciate that the user 75, can use this device 23, from a seated position, and also the user 75, does not need to go on his knees to scan a floor surface 72, or use a ladder to reach a ceiling surface 76, as the device 23, has a plurality of extensions 10, 70, 80, and ranges R1, R2, R3. Similarly, the device or tool 50, 23, can be reoriented from one location to another location 72, 74, 76, as desired by a user 75, In the various exemplary embodiments discussed earlier, the exemplary hatch 20, is engageably and releasably coupled to the tool 50, to perform various functions. In the various exemplary embodiments, the tool 50, could be a surface scanner 50, used to determine the center-point of a wall stud (not shown). In the exemplary embodiments, the exemplary hatch 20, is preferably housed within a cavity 40, of the exemplary tool 50. In the exemplary embodiments, the hatch 20, is allowed to rotate about a vertical axis within the cavity 40, of the exemplary tool 50, by way of the axle 24, 25. In the exemplary embodiments, the hatch 20, preferably has at least one axle 24, 25, while the handle 10, preferably has at least one axle 13, 14, thus allowing the hatch 20, to rotate or move in a first rotational direction, and allowing the handle to rotate or move in a second rotational direction. For example, the first rotational direction could be an up-and-down movement, while the second rotational direction could be a side-to-side movement, or vice versa.

In the exemplary embodiments, when the handle 10, is engaged with the hatch 20, the tool 50, may be moved along a first axis, such as, a horizontal axis, or a vertical axis, while allowing a movement along a second axis, such as, a vertical axis, or a horizontal axis, when so desired by the user 75. In the exemplary embodiment, the tip 12, of the handle 10, after engagement with the hatch 20, creates a fulcrum and operates as a lever to enable the tool 50, to be rotated 360° along the surface 72, 74, 76.

The pole or handle 10, or extension pole 70, or telescopic pole 80, could preferably be made from a material selected from a group comprising plastic, polycarbonate, acrylonitrile butadiene styrene (ABS), composite material, metal, wood, and combinations thereof, to name a few.

The tools 23, used in the present invention to locate the position of wall studs, including but not limited to metal, wood, and plastic studs, metal objects, wooden objects, heat signatures, electrical wiring, plumbing, and other imbedded or hidden gases, liquids, or solids, behind a surface such as, for example, the installed sheetrock or wallboard forming the wall surface, may be implemented on one or more computers executing software instructions. According to one embodiment of the present invention, the tools 23, used may communicate with server 90, and client computer systems 90, that transmit and receive data over a computer network 91, or a fiber or copper-based telecommunications network 91. The steps of accessing, downloading, and manipulating the data, as well as other aspects of the present invention are implemented by central processing units (CPU) in the server 90, and client computers executing sequences of instructions stored in a memory 90. The memory may be a random access memory (RAM) 90, read-only memory (ROM) 90, a persistent store 90, such as a mass storage device 90, or any combination of these devices 90. Execution of the sequences of instructions causes the CPU 90, to perform steps according to embodiments of the present invention.

The instructions may be loaded into the memory of the server or client computers 90, from a storage device 90, or from one or more other computer systems 90, over a network connection 91. For example, a client computer 90, may transmit a sequence of instructions to the server computer 90, in response to a message transmitted to the client over a network 91, by the server 90. As the server 90, receives the instructions over the network connection 91, it stores the instructions in memory 90. The server 90, may store the instructions for later execution, or it may execute the instructions as they arrive over the network connection 91. In some cases, the CPU 90, may directly support the downloaded instructions. In other cases, the instructions may not be directly executable by the CPU 90, and may instead be executed by an interpreter that interprets the instructions. In other embodiments, hardwired circuitry may be used in place of, or in combination with, software instructions to implement the present invention. Thus tools used in the present invention are not limited to any specific combination of hardware circuitry and software, nor to any particular source for the instructions executed by the server or client computers 90. In some instances, the client and server functionality may be implemented on a single computer platform 90.

It should be appreciated that the inventive clip or hatch 20, can be quickly attached or detached from the tool 50, or the handle 10, 70, 80. Furthermore, the hatch 20, is configured in such a manner that under stress it would pop-out of the cavity 40, of the tool 20, or pop-out of the axles 13, 14, on the tip 12, of the handle 10, 70, 80, or vice versa. Thus under stress none of the components 10, 20, 40, 50, would be damaged, and each component 10, 20, 40, 50, could be easily attached or detached, or assembled or reassembled, each from the other.

The embodiments of the present invention are described more fully hereinafter with reference to the accompanying drawings, which form a part hereof, and which show, by way of illustration, specific exemplary embodiments by which the invention may be practiced. This invention may, however, be embodied in many different forms and should not be construed as limited to the embodiments set forth herein. Rather, the disclosed embodiments are provided so that this disclosure will be thorough and complete, and will fully convey the scope of the invention to those skilled in the art.

Throughout the specification and claims, the following terms take the meanings explicitly associated herein, unless the context clearly dictates otherwise. The phrase "in one embodiment" as used herein does not necessarily refer to the same embodiment, though it may. Furthermore, the phrase "in another embodiment" as used herein does not necessarily refer to a different embodiment, although it may. Thus, as described below, various embodiments of the invention may be readily combined, without departing from the scope or spirit of the invention.

Still further, while certain embodiments of the inventions have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions.

As used in this specification and claims, the terms "for example," "for instance," "such as," and "like," and the verbs "comprising," "having," "including," and their other verb forms, when used in conjunction with a listing of one or more components or other items, are each to be construed as open-ended, meaning that the listing is not to be considered as excluding other, additional components or items. Other terms are to be construed using their broadest reasonable meaning unless they are used in a context that requires a different interpretation.

Thus, the present invention is not limited to the embodiments described herein and the constituent elements of the invention can be modified in various manners without departing from the spirit and scope of the invention. Various aspects of the invention can also be extracted from any appropriate combination of a plurality of constituent elements disclosed in the embodiments. Some constituent elements may be deleted in all of the constituent elements disclosed in the embodiments. The constituent elements described in different embodiments may be combined arbitrarily.

What is claimed is:

1. A handle attachment for a mobile device, comprising:
   (a) a handle, said handle having a tip end, and a back end, said tip end, having a first tip axle, and a second tip axle, wherein said first tip axle and said second tip axle are on the opposite side of said tip end;
   (b) a hatch, said hatch having a first hatch axle, and a second hatch axle, wherein said first hatch axle and said second hatch axle are on the opposite side of said hatch, and wherein said hatch further has an extension, wherein said extension has a first spring engaging means, and a second spring engaging means, and wherein said hatch further has a channel area formed by a first channel wall, and a second channel wall;
   (c) a device, said device having a first section, a second section, and a third section, and wherein said second section has a blind hole to releasably and engageably accommodate at least a portion of said hatch; and
   (d) wherein a portion of said tip end of said handle is inserted into a portion of said hatch such that said first tip axle is releasably and engageably secured by said first channel wall, and said second channel wall, and wherein said second tip axle is releasably and engageably secured by said first spring engaging means and said second spring engaging means, and said hatch is releasably and engageably secured to said device within said blind hole to form said handle attachment for a mobile device.

2. The handle attachment for a mobile device of claim 1, wherein said handle has a gripping portion, and wherein said gripping portion has at least one gripping means.

3. The handle attachment for a mobile device of claim 1, wherein said handle has a gripping portion, and wherein said gripping portion has at least one gripping means, and wherein said at least one gripping means are selected from a group consisting of a rubber gripping means, a rough surface gripping means, a series of indentations, a series of protrusions, and a combination thereof.

4. The handle attachment for a mobile device of claim 1, wherein said back end of said handle has at least one mating blind hole.

5. The handle attachment for a mobile device of claim 1, wherein said back end of said handle has at least one mating blind hole, and wherein said at least one mating blind hole has at least one engaging means.

6. The handle attachment for a mobile device of claim 1, wherein said back end of said handle has at least one mating blind hole, and wherein said at least one mating blind hole has at least one engaging means to securely engage an extension handle.

7. The handle attachment for a mobile device of claim 1, wherein said back end of said handle has at least one mating blind hole, and wherein said at least one mating blind hole has at least one engaging means to securely engage an extension handle, and wherein said extension handle is selected from a group consisting of an extension pole, a telescopic pole, and a combination thereof.

8. The handle attachment for a mobile device of claim 1, wherein said hatch has at least one stopper.

9. The handle attachment for a mobile device of claim 1, wherein said extension of said hatch has a first side wall, and a second side wall, and wherein said first sidewall has a first hatch axle, and wherein said second side wall has a second hatch axle, and wherein said first hatch axle is on the opposite side of said second hatch axle.

10. The handle attachment for a mobile device of claim 1, wherein said extension of said hatch has a first leg extension and a second leg extension, and wherein said first leg extensions has a first locking means, and said second leg extension has a second locking means, and wherein first locking means and said second locking means releasably and engageably secure said hatch to said handle.

11. The handle attachment for a mobile device of claim 1, wherein said first section of said device has at least one display area.

12. The handle attachment for a mobile device of claim 1, wherein said device has at least one electronic component contained therein, and wherein said at least one electronic component has at least one means to electronically communicate with at least one computer.

13. The handle attachment for a mobile device of claim 1, wherein said device has at least one anti-skid means.

14. The handle attachment for a mobile device of claim 1, wherein, said device has at least one anti-skid means, and wherein said at least one anti-skid means are selected from a group consisting of a rubber gripping means, a rough surface gripping means, a series of indentations, a series of protrusions, and a combination thereof.

15. The handle attachment for a mobile device of claim 1, wherein said device has at least one battery compartment.

16. The handle attachment for a mobile device of claim 1, wherein a bottom surface of said device has an ink reservoir.

17. The handle attachment for a mobile device of claim 1, wherein a bottom surface of said device has an ink reservoir, and wherein a removeable cap covers said ink reservoir.

18. The handle attachment for a mobile device of claim 1, wherein there is at least one first engaging means and at least one second engaging means in said blind hole of said device, and wherein said at least one first engaging means engages said first hatch axle, and said at least one second engaging means engages said second hatch axle, to releasably and engageably secure said hatch to said device.

19. A handle attachment for a mobile device, comprising:
   (a) a handle, said handle having a tip end, and a back end, said tip end, having a first tip axle, and a second tip axle, wherein said first tip axle and said second tip axle are on the opposite side of said tip end;
   (b) a hatch, said hatch having a first hatch axle, and a second hatch axle, wherein said first hatch axle and said second hatch axle are on the opposite side of said hatch, and wherein said hatch further has an extension, wherein said extension has a first spring engaging means, and a second spring engaging means, and wherein said hatch further has a channel area formed by a first channel wall, and a second channel wall;
   (c) a device, said device having a first section, a second section, and a third section, and wherein said second section has a blind hole to releasably and engageably accommodate at least a portion of said hatch;
   (d) wherein a portion of said tip end of said handle is inserted into a portion of said hatch such that said first tip axle is releasably and engageably secured by said first channel wall, and said second channel wall, and wherein said second tip axle is releasably and engageably secured by said first spring engaging means and said second spring engaging means, and said hatch is releasably and engageably secured to said device within said blind hole to form said handle attachment for a mobile device; and
   (e) wherein said device has at least one chamber to accommodate at least one electronic device.

20. A handle attachment for a mobile device, comprising:
(a) a handle, said handle having a tip end, and a back end, said tip end, having a first tip axle, and a second tip axle, wherein said first tip axle and said second tip axle are on the opposite side of said tip end;
(b) a hatch, said hatch having a first hatch axle, and a second hatch axle, wherein said first hatch axle and said second hatch axle are on the opposite side of said hatch, and wherein said hatch further has an extension, wherein said extension has a first spring engaging means, and a second spring engaging means, and wherein said hatch further has a channel area formed by a first channel wall, and a second channel wall;
(c) a device, said device having a first section, a second section, and a third section, and wherein said second section has a blind hole to releasably and engageably accommodate at least a portion of said hatch;
(d) wherein a portion of said tip end of said handle is inserted into a portion of said hatch such that said first tip axle is releasably and engageably secured by said first channel wall, and said second channel wall, and wherein said second tip axle is releasably and engageably secured by said first spring engaging means and said second spring engaging means, and said hatch is releasably and engageably secured to said device within said blind hole to form said handle attachment for a mobile device; and
(e) wherein said device has at least one chamber to accommodate at least one electronic device, and wherein said at least one electronic device has at least one means to communicate with at least one computer device.

* * * * *